(12) United States Patent
Peng et al.

(10) Patent No.: US 12,356,774 B2
(45) Date of Patent: Jul. 8, 2025

(54) DISPLAY DEVICE

(71) Applicant: Au Optronics Corporation, Hsinchu (TW)

(72) Inventors: Chung En Peng, Hsinchu (TW); Chung-Chan Liu, Hsinchu (TW); Chien-Cheng Chang, Hsinchu (TW); Sheng-Kai Lin, Hsinchu (TW); Hui-Ku Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 821 days.

(21) Appl. No.: 17/515,552

(22) Filed: Nov. 1, 2021

(65) Prior Publication Data

US 2022/0310887 A1    Sep. 29, 2022

(30) Foreign Application Priority Data

Mar. 23, 2021   (TW) .................. 110110404

(51) Int. Cl.
*H10H 20/852* (2025.01)
*H01L 25/075* (2006.01)
(Continued)

(52) U.S. Cl.
CPC ....... *H10H 20/852* (2025.01); *H01L 25/0753* (2013.01); *H10H 20/857* (2025.01);
(Continued)

(58) Field of Classification Search
CPC ... H01L 25/0753; H01L 25/167; H01L 33/62; H01L 33/44; H01L 33/52–54;
(Continued)

(56) References Cited

U.S. PATENT DOCUMENTS 10,170,665 B2   1/2019  Zou et al.
10,522,520 B2   12/2019 Liu et al.
(Continued)

FOREIGN PATENT DOCUMENTS

CN     103560196     2/2014
CN     104183686     2/2018
(Continued)

OTHER PUBLICATIONS

Machine translation of CN111665982 (Year: 2020).*

*Primary Examiner* — Lauren R Bell
(74) *Attorney, Agent, or Firm* — JCIPRNET (57) ABSTRACT

A display device includes a circuit substrate, a blocker, a first and second pad located on the circuit substrate, a light-emitting element, and a first and second connecting portion. The blocker is located on the circuit substrate, and has an opposite first and second side and an opposite third and fourth side. The first pad is adjacent to the first side of the blocker. The second pad is adjacent to the second side of the blocker. The light-emitting element is located on the blocker and the first and second pads, and includes a first and second electrode. The first connecting portion is connected to the first electrode and the first pad. The second connecting portion is connected to the second electrode and the second pad. The third and fourth sides of the blocker are aligned with a side of each of the first and second connecting portions.

18 Claims, 10 Drawing Sheets (51) Int. Cl.
H10H 20/857 (2025.01)
H10H 29/85 (2025.01)
H10H 29/852 (2025.01)
*H01L 25/16* (2023.01)

(52) U.S. Cl.
CPC ........ H10H 29/852 (2025.01); H10H 29/857 (2025.01); *H01L 25/167* (2013.01)

(58) Field of Classification Search
CPC ............... H01L 2224/02233–02251; H01L 2224/10152–10175; H10H 29/10–49; H10H 29/852; H10H 29/857; H10H 20/852; H10H 20/857
See application file for complete search history.

(56) References Cited

U.S. PATENT DOCUMENTS

2019/0131281 A1    5/2019  Liu et al.
2020/0212276 A1*  7/2020  Lim ...................... H01L 33/486

FOREIGN PATENT DOCUMENTS

| CN | 111665982 | 9/2020 |
|---|---|---|
| TW | 201919224 | 5/2019 |

\* cited by examiner

DISPLAY DEVICE

CROSS-REFERENCE TO RELATED APPLICATION

This application claims the priority benefit of Taiwan patent application no. 110110404, filed on Mar. 23, 2021. The entirety of the above-mentioned patent application is hereby incorporated by reference herein and made a part of this specification.

BACKGROUND OF THE INVENTION

Field of the Invention

The invention relates to a display device, and more particularly to a display device that may prevent a circuit substrate from being damaged by laser light.

Description of Related Art

Micro-LED display devices have advantages such as power saving, high efficiency, high brightness, and fast response time. Due to the extremely small size of the micro-LED, the current method of manufacturing the micro-LED display device adopts a mass transfer technique. That is, micro-LED dies are picked and placed using a microelectromechanical array technique, so as to transport a large number of micro-LED dies on the circuit substrate at one time.

However, mass transfer techniques still often result in the dislocation of dies. A current method is to first remove the dislocated micro-LED dies with a laser, and then re-implant the dies for repair. However, when a laser is used for removal, due to the dislocation of the dies, the laser light often damages the circuit substrate, resulting in poor production yield or reliability of the display device.

SUMMARY OF THE INVENTION

The invention provides a display device that may prevent a circuit substrate from being damaged by laser light.

One embodiment of the invention provides a display device, including: a circuit substrate; a blocker located on the circuit substrate and having a first side, a second side opposite to the first side, a third side, and a fourth side opposite to the third side; a first pad located on the circuit substrate and adjacent to the first side of the blocker; a second pad located on the circuit substrate and adjacent to the second side of the blocker; a light-emitting element located on the blocker, the first pad, and the second pad, and including a first electrode and a second electrode; a first connecting portion connected to the first electrode and the first pad; and a second connecting portion connected to the second electrode and the second pad, wherein the third side and the fourth side of the blocker are aligned with a side of the first connecting portion and a side of the second connecting portion.

In an embodiment of the invention, the first pad and the second pad are in close contact with the blocker.

In an embodiment of the invention, a top surface of the blocker is not higher than a top surface of the first connecting portion or the second connecting portion.

In an embodiment of the invention, a height of the blocker is between 1 µm and 2 µm.

In an embodiment of the invention, the blocker is not in contact with the light-emitting element.

In an embodiment of the invention, an orthographic projection of the blocker at the circuit substrate is located between an orthographic projection of the first connecting portion at the circuit substrate and an orthographic projection of the second connecting portion at the circuit substrate.

In an embodiment of the invention, the blocker is sandwiched between the first connecting portion and the second connecting portion.

In an embodiment of the invention, the first connecting portion and the second connecting portion include a metal or a conductive adhesive.

In an embodiment of the invention, the display device further includes an insulating layer. The insulating layer is located between the first pad and the second pad and the circuit substrate, and the blocker and the insulating layer belong to a same film layer.

In an embodiment of the invention, the circuit substrate includes an active element, and the active element is electrically connected to the first pad or the second pad.

In an embodiment of the invention, the blocker has an opening, and a spacing between the opening and the third side of the blocker and a spacing between the opening and the fourth side of the blocker are greater than or equal to 3 µm.

In an embodiment of the invention, an aperture of the opening in a direction perpendicular to the third side or the fourth side is between 8 µm and 12 µm.

In an embodiment of the invention, the opening divides the blocker into a first portion and a second portion, and the first portion has the third side, and the second portion has the fourth side.

In an embodiment of the invention, the first portion is separated from the second portion.

In an embodiment of the invention, a width of the first portion and the second portion in a direction perpendicular to the third side or the fourth side is between 3 µm and 5 µm.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1D shows a schematic cross-sectional view along section line B-B' of

FIG. 1B and a schematic view of the relative position of the irradiation range of a laser light.

FIG. 1E shows a schematic cross-sectional view along section line C-C' of

FIG. 1B and a schematic view of the relative position of the irradiation range of a laser light.

FIG. 1F shows a schematic cross-sectional view along section line D-D' of

FIG. 1B and a schematic view of the relative position of the irradiation range of a laser light.

FIG. 2D shows a schematic cross-sectional view along section line G-G' of

FIG. 2B and a schematic view of the relative position of the irradiation range of a laser light.

FIG. 2E shows a schematic cross-sectional view along section line H-H' of

FIG. 2B and a schematic view of the relative position of the irradiation range of a laser light.

DESCRIPTION OF THE EMBODIMENTS

Figure 1A:
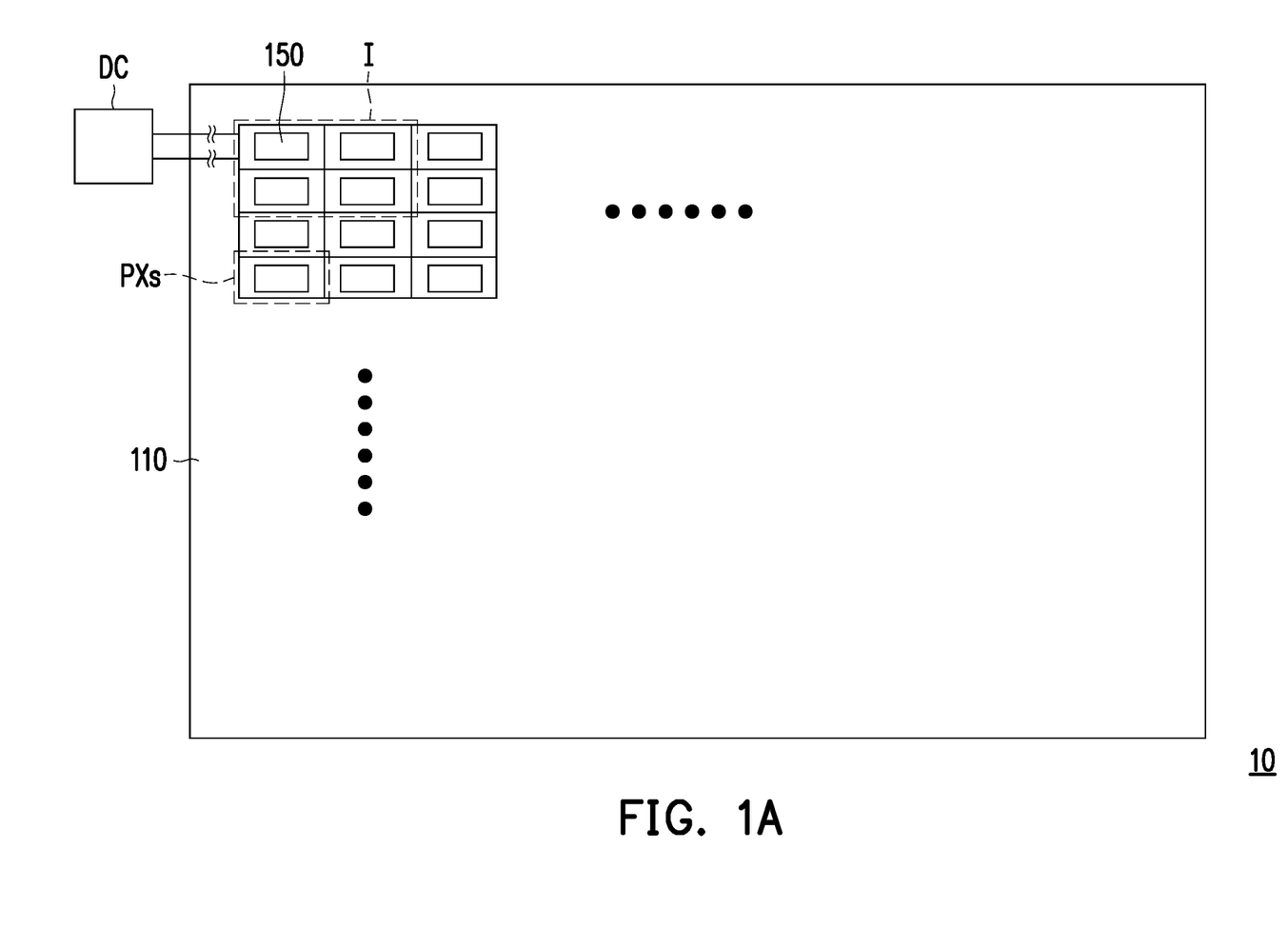
FIG. 1A is a schematic top view of a display device 10 according to an embodiment of the invention.
Figure 1B:
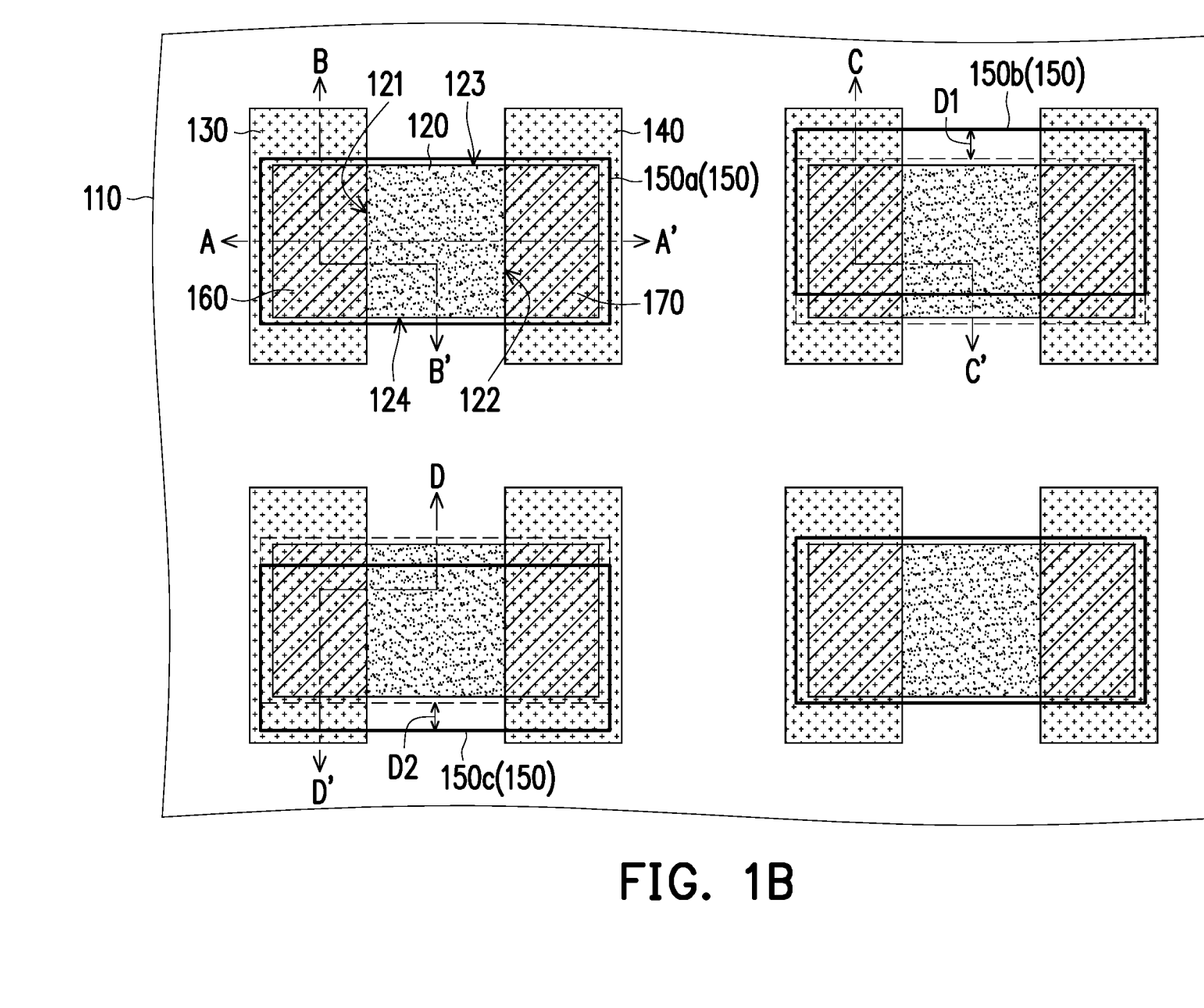
FIG. 1B is an enlarged schematic diagram of a region I of the display device 10 of FIG. 1A before repair.
Figure 1C:
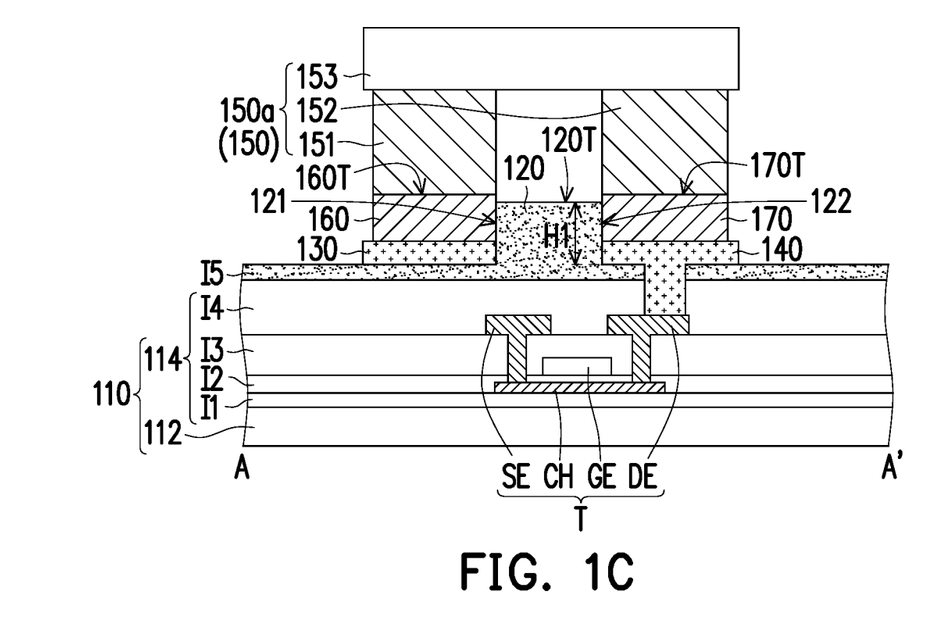
FIG. 1C is a schematic cross-sectional view along section line A-A' of FIG. 1B.
Figure 1D:
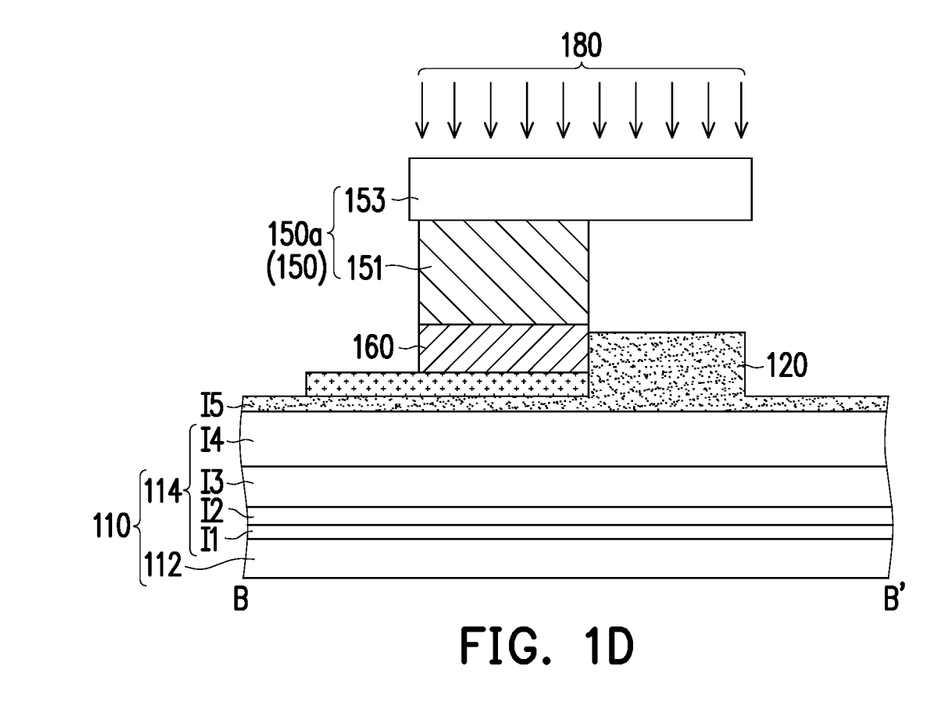
Figure 1E:
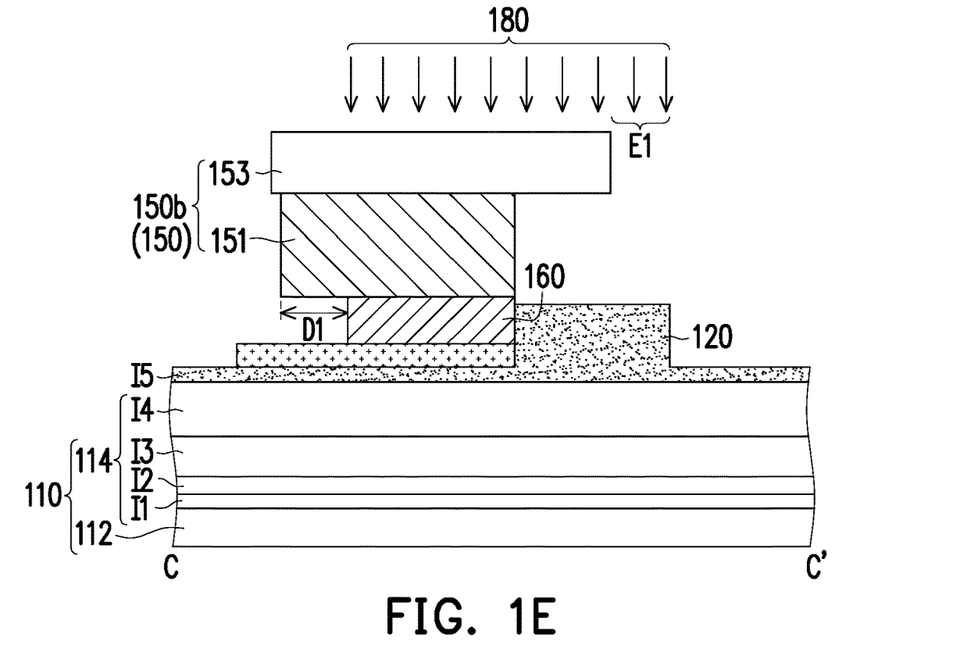
Figure 1F:
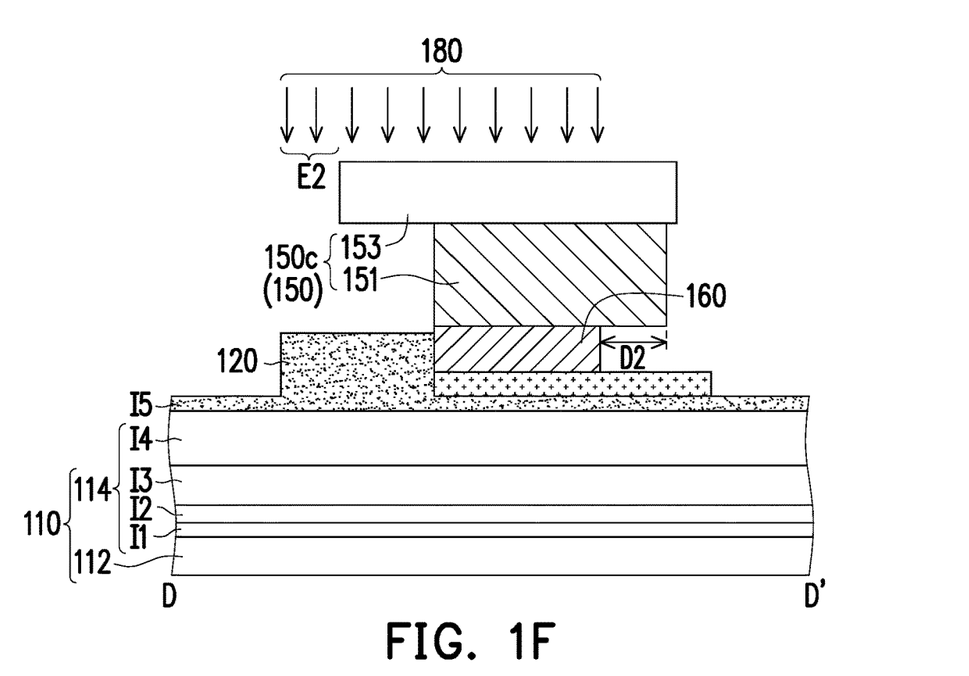
Figure 1G:
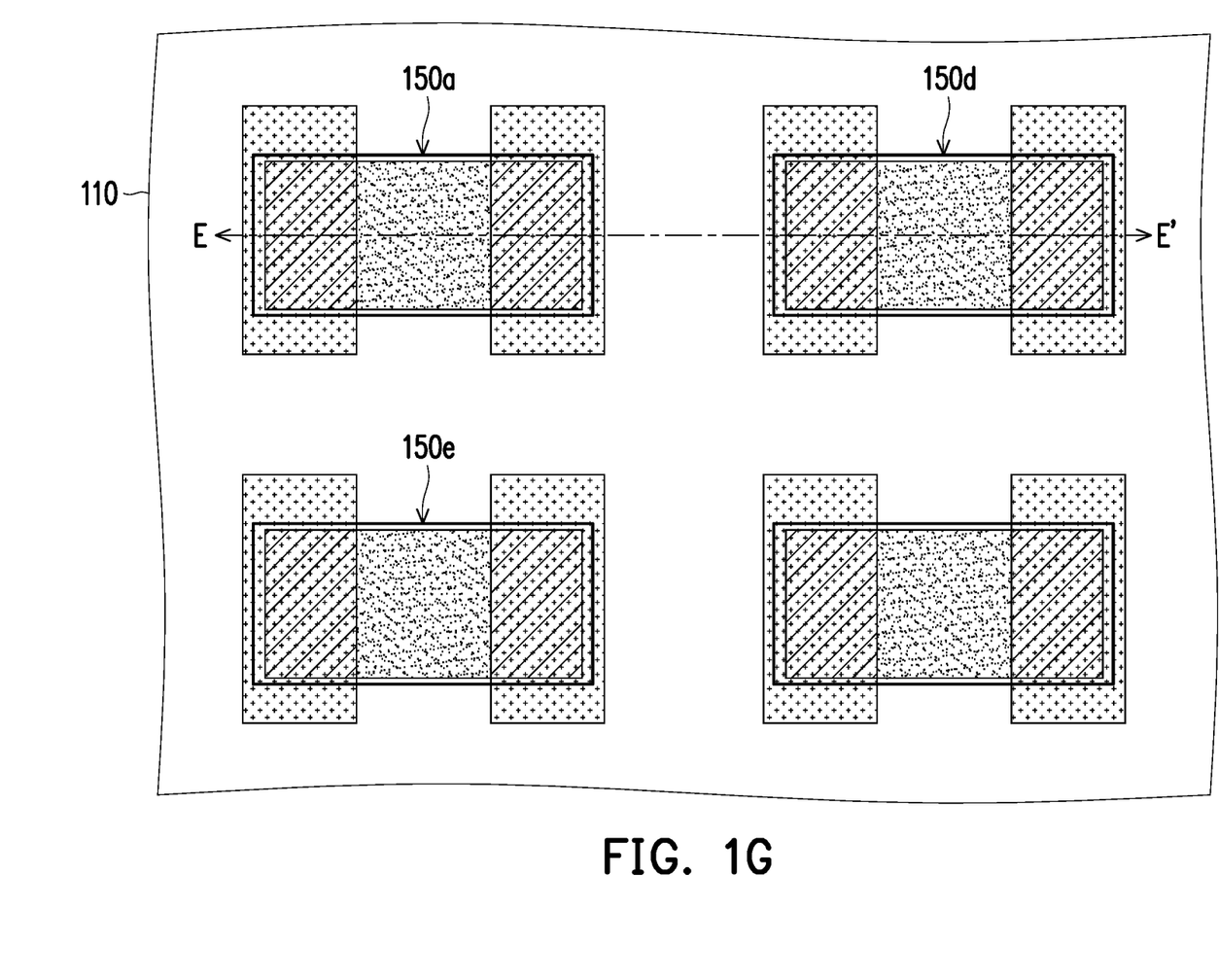
FIG. 1G is an enlarged schematic diagram of the region I of the display device 10 of FIG. 1A after repair.
Figure 1H:
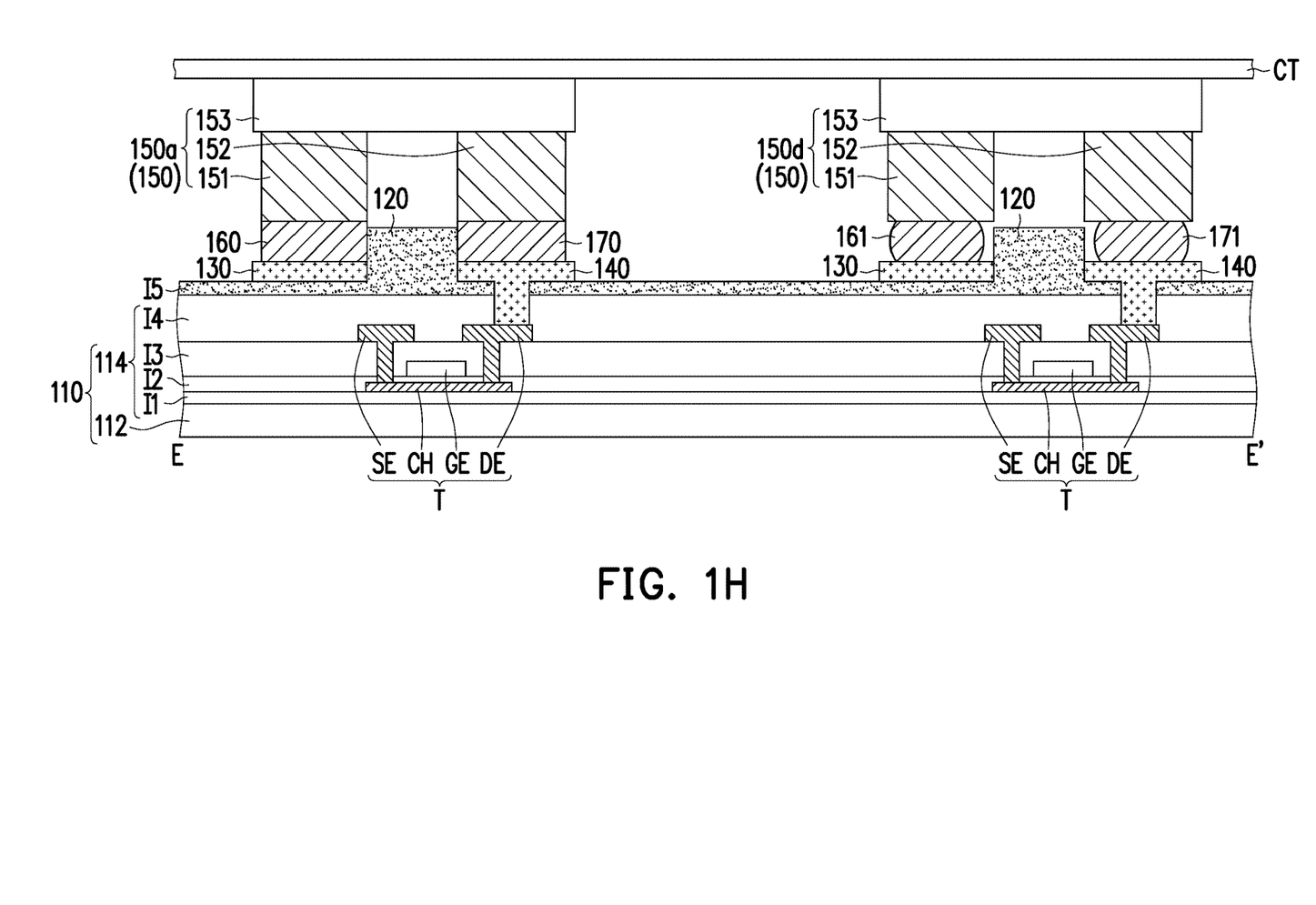
FIG. 1H is a schematic cross-sectional view along section line E-E' of FIG. 1G.

FIG. 1A is a schematic top view of a display device 10 according to an embodiment of the invention. FIG. 1B is an enlarged schematic diagram of a region I of the display device 10 of FIG. 1A before repair. FIG. 1C is a schematic cross-sectional view along section line A-A' of FIG. 1B. FIG. 1D shows a schematic cross-sectional view along section line B-B' of FIG. 1B and a schematic view of the relative position of the irradiation range of a laser light. FIG. 1E shows a schematic cross-sectional view along section line C-C' of FIG. 1B and a schematic view of the relative position of the irradiation range of a laser light. FIG. 1F shows a schematic cross-sectional view along section line D-D' of FIG. 1B and a schematic view of the relative position of the irradiation range of a laser light. FIG. 1G is an enlarged schematic diagram of a region I of the display device 10 of FIG. 1A after repair. FIG. 1H is a schematic cross-sectional view along section line E-E' of FIG. 1G. In order to make the representation of the figures more concise, FIG. 1A schematically shows a circuit substrate 110 and a light-emitting element 150, and other components are omitted.

Referring to FIG. 1A to FIG. 1C, the display device 10 includes: the circuit substrate 110, a blocker 120, a first pad 130, a second pad 140, the light-emitting element 150, a first connecting portion 160, and a second connecting portion 170. The blocker 120 is located on the circuit substrate 110, and has a first side 121, a second side 122 opposite to the first side 121, a third side 123, and a fourth side 124 opposite to the third side 123. The first pad 130 is located on the circuit substrate 110 and adjacent to the first side 121 of the blocker 120. The second pad 140 is located on the circuit substrate 110 and adjacent to the second side 122 of the blocker 120. The light-emitting element 150 is located on the blocker 120, the first pad 130, and the second pad 140, and includes a first electrode 151 and a second electrode 152. The first connecting portion 160 is connected to the first electrode 151 and the first pad 130. The second connecting portion 170 is connected to the second electrode 152 and the second pad 140. In particular, the third side 123 and the fourth side 124 of the blocker 120 are aligned with a side of the first connecting portion 160 and a side of the second connecting portion 170.

In the display device 10 of an embodiment of the invention, when the dislocated light-emitting element 150 is removed using laser light, the blocker 120 may prevent the laser light from damaging the circuit substrate 110, thereby improving the production yield or reliability of the display device 10. Hereinafter, in conjunction with FIG. 1A to FIG. 1H, the implementation of each element of the display device 10 is explained, but the invention is not limited thereto.

Specifically, the display device 10 may include a plurality of sub-pixels PXs, and the plurality of sub-pixels PXs are arranged in an array. Each of the sub-pixels PXs is mainly formed by the light-emitting element 150. In the present embodiment, the display device 10 may further include a drive element DC, and the drive element DC may be electrically connected to the sub-pixels PXs to transmit signals to the light-emitting element 150. For example, the light-emitting element 150 is electrically connected to the first pad 130 and the second pad 140, and the drive element DC may be electrically connected to the first pad 130 and the second pad 140, respectively. In some embodiments, the first pads 130 in the plurality of sub-pixels PXs are separated from each other, and independently receive the signal provided by the drive element DC. In some embodiments, the second pads 140 in the plurality of sub-pixels PXs may be electrically connected to each other and/or the same common voltage may be applied to the second pads 140 during operation. In some embodiments, the drive element DC may be a chip bonded to the circuit substrate 110 or a circuit element (including an active element, a passive element, or a combination thereof) directly formed in the circuit substrate 110.

Each of the sub-pixels PXs of the display device 10 includes, for example: the circuit substrate 110, the blocker 120, the first pad 130, the second pad 140, the light-emitting element 150, the first connecting portion 160, and the second connecting portion 170. The blocker 120, the first pad 130, and the second pad 140 are disposed on the surface of the circuit substrate 110, and the first electrode 151 of the light-emitting element 150 is electrically connected to the first pad 130 via the first connecting portion 160, and the second electrode 152 of the light-emitting element 150 is electrically connected to the second pad 140 via the second connecting portion 170.

In the present embodiment, the circuit substrate 110 may include a bottom plate 112 and a drive circuit layer I14. The bottom plate 112 of the circuit substrate 110 may be a transparent substrate or a non-transparent substrate, and the material thereof may be a quartz substrate, a glass substrate, a polymer substrate, or other suitable materials, but the invention is not limited thereto. The drive circuit layer I14 may include elements or circuits needed by the display device 10, such as driving elements, switching elements, storage capacitors, power lines, drive signal lines, timing signal lines, current compensation lines, and detection signal lines.

In some embodiments, the drive circuit layer I14 may be formed on the bottom plate 112 by using a thin-film deposition process, a photomask process, and an etching process, and the drive circuit layer I14 may include an active element array, wherein the active element array includes a plurality of active elements T arranged in an array.

In the present embodiment, the drive circuit layer I14 includes a buffer layer I1, the active elements T, a gate insulating layer I2, an interlayer insulating layer I3, and a flat layer I4. In other embodiments, the drive circuit layer I14 may include more insulating layers and conductive layers as needed. The active elements T are formed by a semiconductor layer CH, a gate GE, a source SE, and a drain DE. The region where the semiconductor layer CH is overlapped with the gate GE may be regarded as the channel region of the active elements T. The gate insulating layer I2 is located between the gate GE and the semiconductor layer CH, and the interlayer insulating layer I3 is disposed between the source SE and the gate GE and between the drain DE and the gate GE. The gate GE and the source SE may respectively receive signals from the drive element DC. The material of the semiconductor layer CH may include a silicon semiconductor material (such as polysilicon, amorphous silicon, etc.), an oxide semiconductor material, or an organic semiconductor material. The material of the gate GE, the source SE, and the drain DE may include a metal with good conductivity, such as a metal such as aluminum, molybdenum, titanium, and copper, but the invention is not limited thereto.

An insulating layer I5 may be formed on the drive circuit layer I14 by using a thin-film deposition process, a photomask process, and an etching process. In the present embodiment, the blocker 120 and the insulating layer I5 may belong to the same film layer, but the invention is not limited thereto. In other embodiments, the blocker 120 may also be located on the insulating layer I5 and belong to a different film layer from the insulating layer I5.

The material of the buffer layer I1, the gate insulating layer I2, the interlayer insulating layer I3, and the insulating layer I5 may include a transparent insulating material, such as silicon oxide, silicon nitride, silicon oxynitride, or stacked layers of the above materials, but the invention is not limited thereto. The material of the flat layer I4 may include a transparent insulating material, such as an organic material, an acrylic material, a siloxane material, a polyimide material, an epoxy material, etc., but the invention is not limited thereto. The buffer layer I1, the gate insulating layer I2, the interlayer insulating layer I3, the flat layer I4, and the insulating layer I5 may also have a single-layer structure or a multi-layer structure, respectively. The multi-layer structure is, for example, a stack of any two or more layers of the above insulating materials that may be combined and changed as needed.

After the blocker 120 and the insulating layer I5 are formed, a plurality of first pads 130 and a plurality of second pads 140 may be formed on the insulating layer I5 using a thin-film deposition process, a photomask process, and an etching process, so that the insulating layer I5 is located between the plurality of first pads 130 and the plurality of second pads 140 and the circuit substrate 110. In the present embodiment, the second pads 140 are electrically connected to the active elements T via through holes in the insulating layer I5 and the flat layer I4, but the invention is not limited thereto. In other embodiments, the active elements T may also be electrically connected to the first pads 130.

The first pads 130 and the second pads 140 may have a single-layer structure or a structure in which a plurality of conductive layers are stacked. For example, the first pads 130 and the second pads 140 may have a structure in which a metal such as aluminum, molybdenum, titanium, copper, and indium tin oxide (ITO), indium zinc oxide (IZO), indium gallium zinc oxide (IGZO), or other suitable conductive oxides are stacked, but the invention is not limited thereto.

In the present embodiment, the first pads 130 and the second pads 140 are located on the insulating layer I5, and the first pads 130 are attached to or closely in contact with the first side 121 of the blocker 120, and the second pads 140 are attached to or closely in contact with the second side 122 of the blocker 120. In some embodiments, there is no gap between the blocker 120 and the first pads 130 or between the blocker 120 and the second pads 140. In this way, it may be ensured that the region between the blocker 120 and the first pads 130 or the second pads 140 is not damaged by the laser.

In the present embodiment, the light-emitting element 150 may include the first electrode 151, the second electrode 152, and a light-emitting stack 153, and the first electrode 151 and the second electrode 152 are electrically connected to different layers in the light-emitting stack 153, respectively. For example, the light-emitting stack 153 may include two semiconductor layers and a light-emitting layer sandwiched between the two semiconductor layers. Moreover, the first electrode 151 may be electrically connected to one of the two semiconductor layers, and the second electrode 152 may be electrically connected to the other of the two semiconductor layers. The material of the first electrode 151 and the second electrode 152 may include a metal, an alloy, nitride of a metal material, oxide of a metal material, oxynitride of a metal material, or other suitable materials or stacked layers of metal materials and other conductive materials or other low-resistance materials.

After the light-emitting element 150 is manufactured on a growth substrate, it is transferred onto the circuit substrate 110 via a mass transfer process. In addition, the first electrode 151 and the second electrode 152 are electrically connected to the first pads 130 and the second pads 140 via the first connecting portion 160 and the second connecting portion 170, respectively. The material of the first connecting portion 160 and the second connecting portion 170 is, for example, a metal, a conductive adhesive, or other materials. In addition, other conductive materials or conductive adhesives may be further included between the first connecting portion 160 and the second connecting portion 170 and the first pads 130 and the second pads 140.

In the present embodiment, a top surface 120T of the blocker 120 is not higher than a top surface 160T of the first connecting portion 160 or a top surface 170T of the second connecting portion 170, so as not to affect the bonding of the first electrode 151 and the second electrode 152 with the first connection portion 160 and the second connection portion 170 during the mass transfer process. In some embodiments, the top surface 120T of the blocker 120 is lower than the top surface 160T of the first connecting portion 160 or the top surface 170T of the second connecting portion 170 so that the blocker 120 is not in contact with the light-emitting element 150. In some embodiments, since the depth of influence of the laser does not exceed 2 μm, a height H1 of the blocker 120 may be between 1 μm and 2 μm.

In the present embodiment, the third side 123 of the blocker 120 is aligned with a side of the first connecting portion 160 and a side of the second connecting portion 170, and the fourth side 124 of the blocker 120 is also aligned with a side of the first connecting portion 160 and a side of the second connecting portion 170. In other words, in the direction perpendicular to the third side 123 or the fourth side 124, the blocker 120 is extended to at least the third side 123 and the fourth side 124, which are both aligned with the sides of the first connecting portion 160 and the second connecting portion 170.

In the present embodiment, the orthographic projection of the first connecting portion 160 at the circuit substrate 110 is located in the orthographic projection of the first pads 130 at the circuit substrate 110, and the orthographic projection of the second connecting portion 170 at the circuit substrate 110 is located in the orthographic projection of the second pads 140 at the circuit substrate 110. In some embodiments, the first connecting portion 160 may be optionally attached to or closely in contact with the first side 121 of the blocker 120, and the second connecting portion 170 may be optionally attached to or closely in contact with the second side 122 of the blocker 120. In other embodiments, the first connecting portion 160 and the second connecting portion 170 do not have to be in contact with the blocker 120. Therefore, the orthographic projection of the blocker 120 at the circuit substrate 110 may be located between the orthographic projection of the first connecting portion 160 at the circuit substrate 110 and the orthographic projection of the second connecting portion 170 at the circuit substrate 110. In some embodiments, when the first connecting portion 160 is attached to or closely in contact with the first side 121 of the blocker 120, and the second connecting portion 170 is attached to or closely in contact with the second side 122 of the blocker 120, the blocker 120 is sandwiched between the first connecting portion 160 and the second connecting portion 170.

In the present embodiment, the configuration area of the first connecting portion 160 and the second connecting portion 170 and the area between the first connecting portion 160 and the second connecting portion 170 may be irradiated by a laser light 180, so that the first connecting portion 160 and the second connecting portion 170 are separated from the first pads 130 and the second pads 140 to remove the light-emitting element 150. In other words, the irradiation range of the laser light 180 may be the configuration area of the first connecting portion 160 and the second connecting portion 170 and the area between the first connecting portion 160 and the second connecting portion 170. Generally speaking, the orthographic projection area of the light-emitting element 150 at the circuit substrate 110 may be similar to or slightly larger than the irradiation area of the laser light 180. Therefore, when the light-emitting element 150 is accurately transferred to a predetermined position, the irradiation range of the laser light 180 may completely fall on the light-emitting element 150.

Please refer to FIG. 1B. FIG. 1B shows the positions of a light-emitting element 150a (top left), a light-emitting element 150b (top right), and a light-emitting element 150c (bottom left) transferred onto the circuit substrate 110 after a mass transfer process, wherein the light-emitting element 150a is substantially located at a predetermined position, the light-emitting element 150b is shifted upward by a distance D1, and the light-emitting element 150c is shifted downward by a distance D2.

Therefore, the light-emitting element 150b and the light-emitting element 150c need to be removed and repaired.

Please refer to FIG. 1B and FIG. 1D at the same time. When the mass transfer is almost error-free and the light-emitting element 150a is substantially located at the predetermined position, since the light-emitting element 150a is not shifted, the irradiation range of the laser light 180 is completely overlapped with the light-emitting element 150a. Via the shielding of the light-emitting element 150a, the circuit substrate 110 is not damaged by the laser light 180.

Please refer to FIG. 1B and FIG. 1E at the same time. Since the light-emitting element 150b is shifted upward by the distance D1, a portion of a laser light E1 is not overlapped with the light-emitting element 150b. In the present embodiment, since the blocker 120 may shield a portion of the laser light E1, the portion of the laser light E1 may be prevented from damaging the circuit substrate 110 below.

Please refer to FIG. 1B and FIG. 1F at the same time. Since the light-emitting element 150c is shifted upward by the distance D2, a portion of a laser light E2 is not overlapped with the light-emitting element 150c. In the present embodiment, since the blocker 120 may shield a portion of the laser light E2, the portion of the laser light E2 may be prevented from damaging the circuit substrate 110 below.

Please refer to FIG. 1G and FIG. 1H at the same time. After the light-emitting elements 150b and 150c are removed, the first electrode 151 and the second electrode 152 of light-emitting elements 150d and 150e are connected to the first pads 130 and the second pads 140 via a first connecting material 161 and a second connecting material 171, respectively, to complete the repair. However, the light-emitting elements 150d and 150e are not limited to be bonded to the first pads 130 and the second pads 140 for repair. In addition, the material of the first connecting material 161 and the second connecting material 171 may be conductive adhesive or other suitable conductive bonding materials.

In some embodiments, a plurality of light-emitting elements 150 may all be blue light-emitting diodes, and the display device 10 may further include a color conversion layer CT disposed on the plurality of light-emitting elements 150, wherein the color conversion layer CT may include phosphors or wavelength conversion materials with similar properties to convert the blue light emitted by the blue light-emitting diodes into light of different colors to achieve a full-color display effect. In other embodiments, the plurality of light-emitting elements 150 may include a plurality of red light-emitting diodes, a plurality of green light-emitting diodes, and a plurality of blue light-emitting diodes, so as to achieve a full-color display effect.

When the luminous colors of the plurality of light-emitting elements 150 themselves are different, the color conversion layer CT in FIG. 1H may be optionally omitted or retained in the display device 10. In some other embodiments, the plurality of light-emitting elements 150 may all be white light-emitting diodes, and the color conversion layer CT may be a color filter layer to achieve a full-color display effect.

Figure 2A:
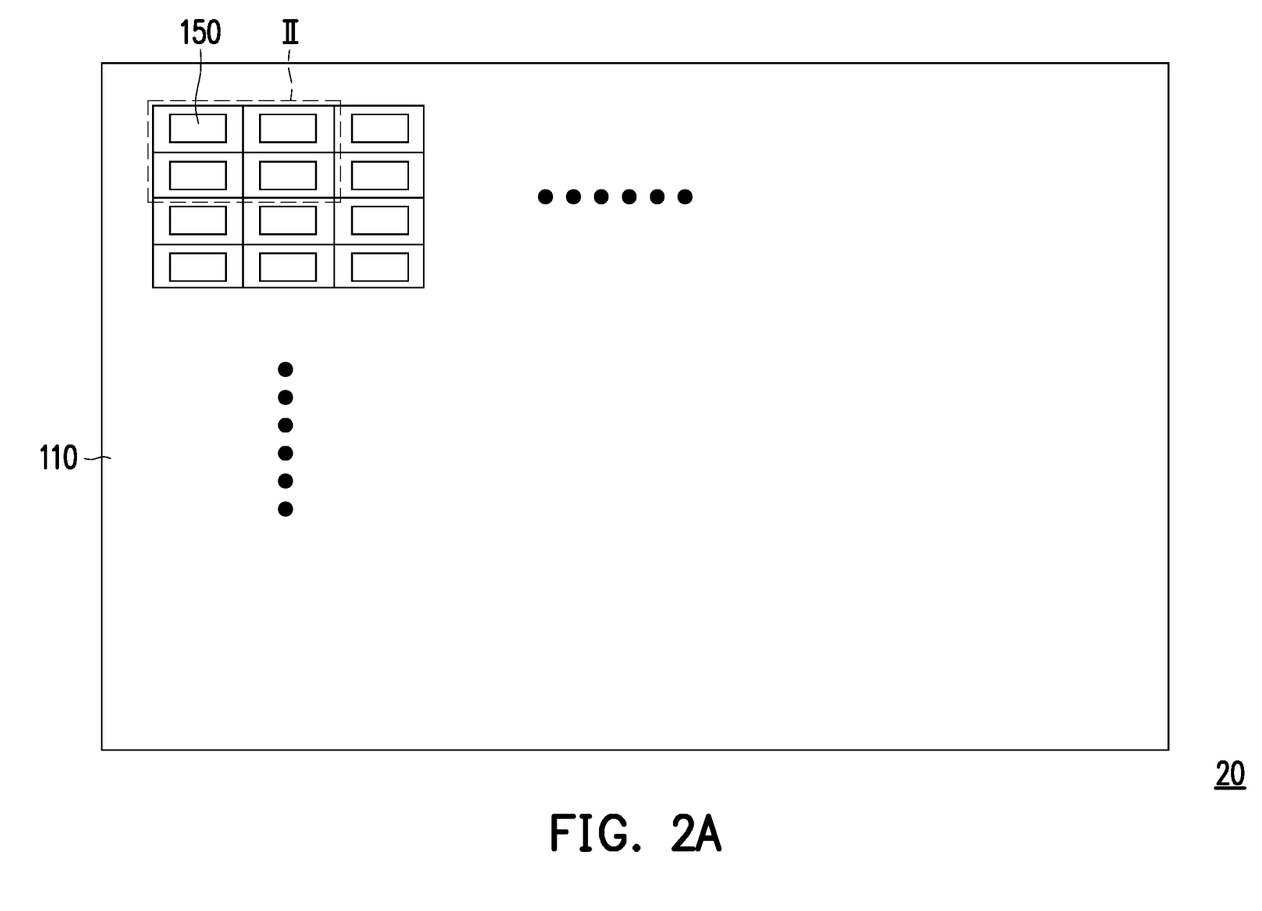
FIG. 2A is a schematic top view of a display device 20 according to an embodiment of the invention.
Figure 2B:
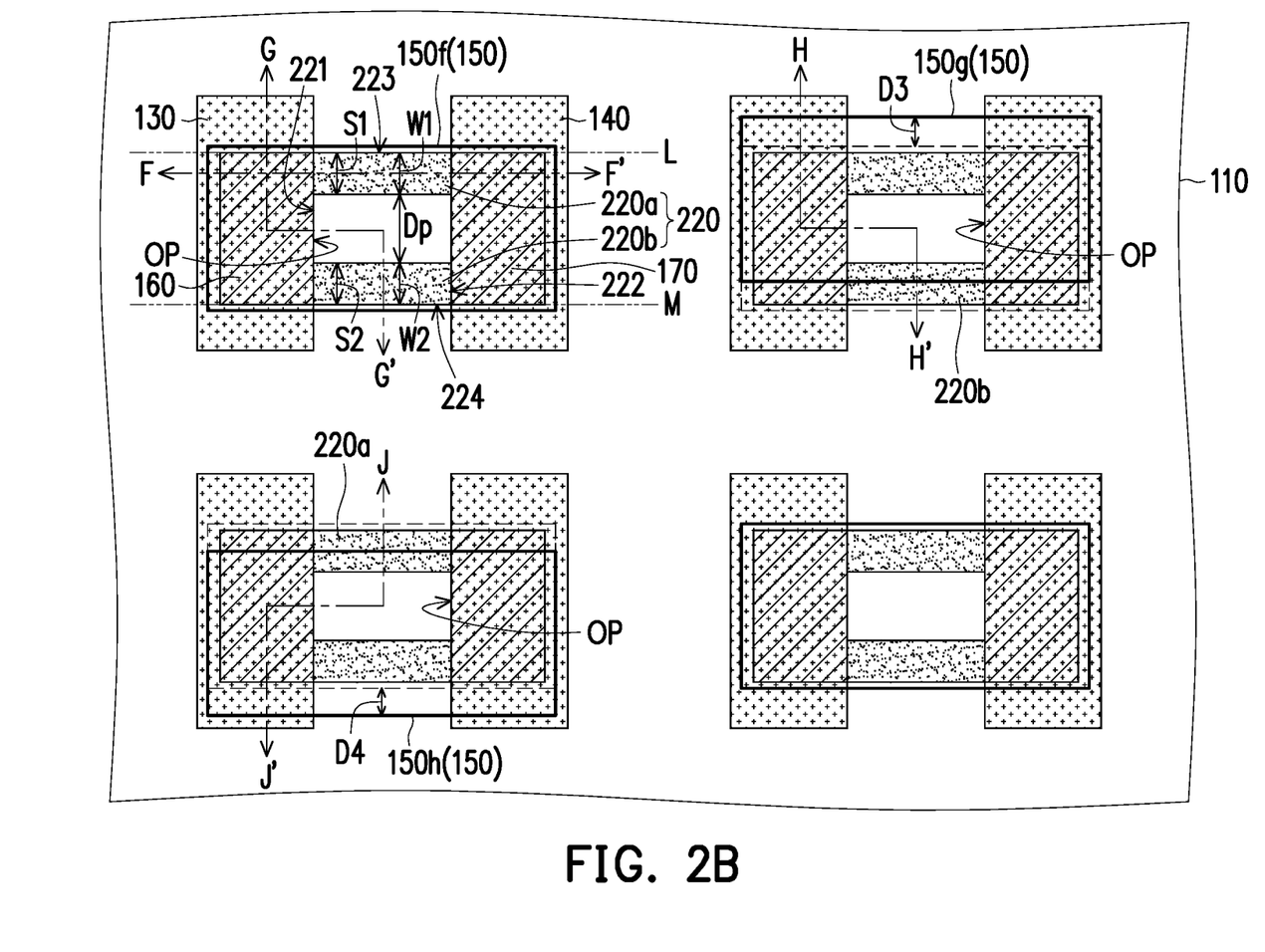
FIG. 2B is an enlarged schematic diagram of a region II of the display device 20 of FIG. 2A before repair.
Figure 2C:
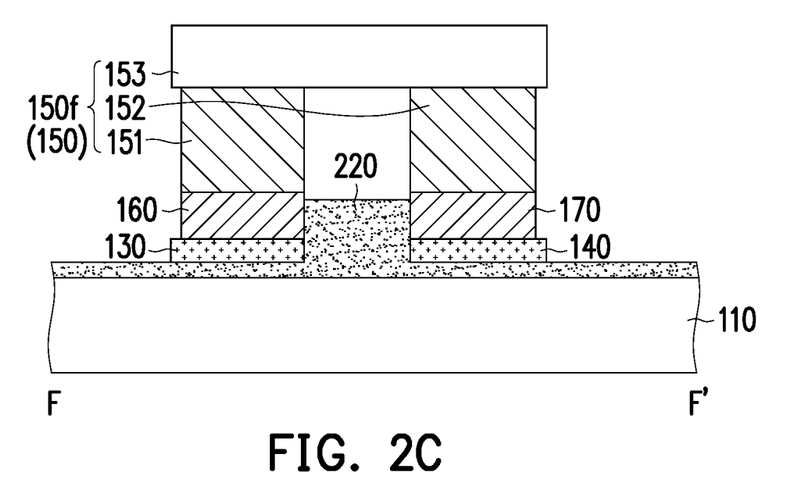
FIG. 2C is a schematic cross-sectional view along section line F-F' of FIG. 2B.
Figure 2D:
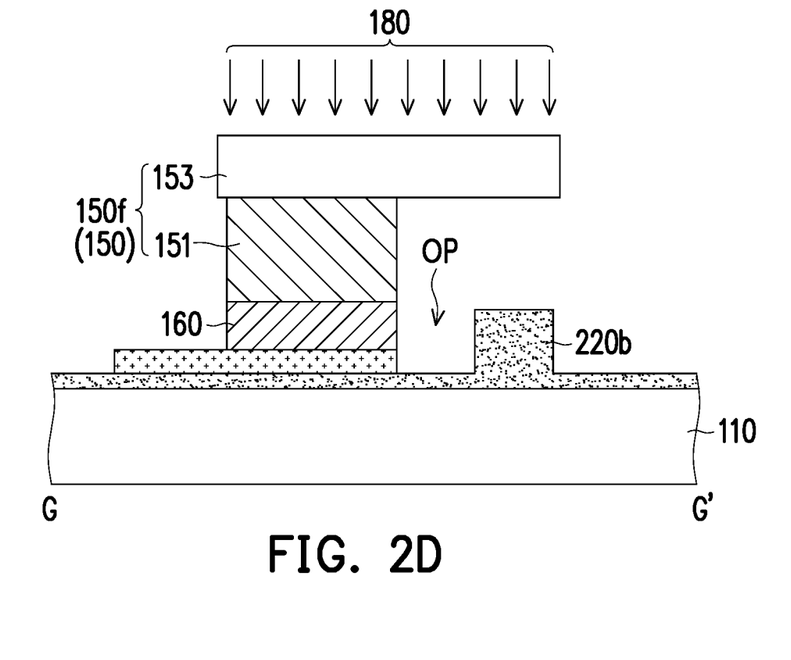
Figure 2E:
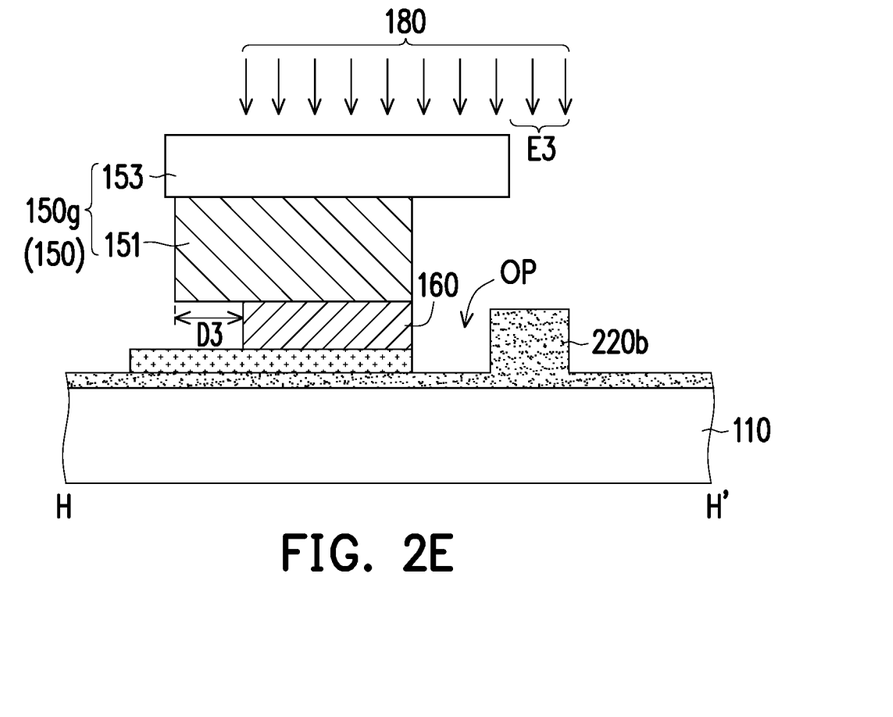
Figure 2F:
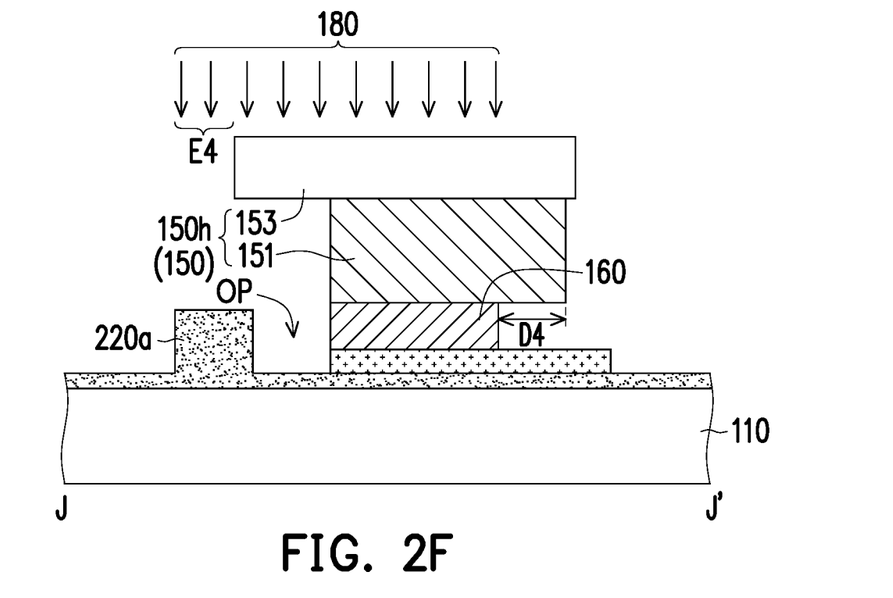
FIG. 2F shows a schematic cross-sectional view along section line J-J' of FIG. 2B and a schematic view of the relative position of the irradiation range of a laser light.

FIG. 2A is a schematic top view of a display device 20 according to an embodiment of the invention. FIG. 2B is an enlarged schematic diagram of a region II of the display device 20 of FIG. 2A before repair. FIG. 2C is a schematic cross-sectional view along section line F-F' of FIG. 2B. FIG. 2D shows a schematic cross-sectional view along section line G-G' of FIG. 2B and a schematic view of the relative position of the irradiation range of a laser light. FIG. 2E shows a schematic cross-sectional view along section line H-H' of FIG. 2B and a schematic view of the relative position of the irradiation range of a laser light. FIG. 2F shows a schematic cross-sectional view along section line J-J' of FIG. 2B and a schematic view of the relative position of the irradiation range of a laser light. In order to make the representation of the figures more concise, FIG. 2A schematically shows the circuit substrate 110 and the light-emitting element 150, and other components are omitted.

In the following, the reference numerals and related content of the embodiment of FIG. 1A to FIG. 1H are adopted, wherein the same or similar numerals are used to represent the same or similar elements and descriptions of the same technical contents are omitted. Regarding the description of the omitted parts, reference may be made to the embodiments of FIG. 1A to FIG. 1H, and the omitted parts are not repeated in the following description.

Referring to FIG. 2A to FIG. 2C, the display device 20 includes: the circuit substrate 110, a blocker 220, the first pad 130, the second pad 140, the light-emitting element 150, the first connecting portion 160, and the second connecting portion 170. The blocker 220 is located on the circuit substrate 110, and has a first side 221, a second side 222 opposite to the first side 221, a third side 223, and a fourth side 224 opposite to the third side 223. The first pad 130 is located on the circuit substrate 110 and adjacent to the first side 221 of the blocker 220. The second pad 140 is located on the circuit substrate 110 and adjacent to the second side 222 of the blocker 220. The light-emitting element 150 is located on the blocker 220, the first pad 130, and the second pad 140, and includes the first electrode 151, the second electrode 152, and the light-emitting stack 153. The first connecting portion 160 is connected to the first electrode 151 and the first pad 130. The second connecting portion 170 is connected to the second electrode 152 and the second pad 140, wherein the third side 223 and the fourth side 224 of the blocker 220 are aligned with a side of the first connecting portion 160 and a side of the second connecting portion 170.

Compared with the display device 10 shown in FIG. 1A to FIG. 1H, the structure in the display device 20 shown in FIG. 2A to FIG. 2F is different in that the blocker 220 of the display device 20 has an opening OP.

Considering that the precision error of the mass transfer process is usually about 3 μm, therefore, in the present embodiment, please refer to FIG. 2B, the blocker 220 only needs to cover an area with a width of at least 3 μm downward from an upper side connecting line L of the first connecting portion 160 and the second connecting portion 170 and an area with a width of at least 3 μm upward from a lower side connecting line M of the first connecting portion 160 and the second connecting portion 170 to ensure that the circuit substrate 110 is not damaged by the laser light 180 without having to completely cover the area between the upper side connecting line L and the lower side connecting line M. Therefore, the blocker 220 may have the opening OP, and a spacing S1 between the opening OP and the third side 223 of the blocker 220 and a spacing S2 between the opening OP and the fourth side 224 of the blocker 220 may be greater than or equal to 3 In this way, it may be ensured that the blocker 220 may shield the laser light 180 under any shift state of the light-emitting element 150 due to the mass transfer process.

In the present embodiment, the opening OP may divide the blocker 220 into a first portion 220a and a second portion 220b, wherein the first portion 220a has the third side 223, the second portion 220b has the fourth side 224, and the first portion 220a is separated from the second portion 220b, but the invention is not limited thereto. In some embodiments, the first portion 220a may also be connected to the second portion 220b.

In some embodiments, by designing widths W1 and W2 of the first portion 220a and the second portion 220b in a direction perpendicular to the third side 223 or the fourth side 224 to be between 3 μm and 5 μm, it may also be ensured that the first portion 220a and the second portion 220b may both shield the laser light 180 in any shift state of the light-emitting element 150 due to the mass transfer process. In some embodiments, a diameter Dp of the opening OP in a direction perpendicular to the third side 223 or the fourth side 224 may be between 8 μm and 12 μm. It may also be said that the spacing between the first portion 220a and the second portion 220b may be between 8 μm and 12 μm.

In the present embodiment, the configuration area of the first connecting portion 160 and the second connecting portion 170 and the area between the first connecting portion 160 and the second connecting portion 170 are irradiated by the laser light 180, so that the first connecting portion 160 and the second connecting portion 170 are separated from the first pad 130 and the second pad 140 to remove the light-emitting element 150. The orthographic projection area of the light-emitting element 150 at the circuit substrate 110 may be similar to or slightly larger than the irradiation area of the laser light 180. Therefore, when the light-emitting element 150 is transferred to a predetermined position, the irradiation range of the laser light 180 completely falls on the light-emitting element 150.

Please refer to FIG. 2B. FIG. 2B shows the positions of a light-emitting element 150*f* (top left), a light-emitting element 150*g* (top right), and a light-emitting element 150*h* (bottom left) transferred onto the circuit substrate 110 after a mass transfer process, wherein the light-emitting element 150*f* is substantially located at a predetermined position, the light-emitting element 150*g* is shifted upward by a distance D3, and the light-emitting element 150*h* is shifted downward by a distance D4. Therefore, the light-emitting element 150*g* and the light-emitting element 150*h* need to be removed and repaired.

Please refer to FIG. 2B and FIG. 2D at the same time. When the mass transfer is almost error-free and the light-emitting element 150*f* is substantially located at the predetermined position, since the light-emitting element 150*f* is not shifted, the irradiation range of the laser light 180 is completely overlapped with the light-emitting element 150*f*. Via the shielding of the light-emitting element 150*f*, the circuit substrate 110 is not damaged by the laser light 180.

Please refer to FIG. 2B and FIG. 2E at the same time. Since the light-emitting element 150*g* is shifted upward by the distance D3, a portion of a laser light E3 is not overlapped with the light-emitting element 150*g*. In the present embodiment, since the second portion 220*b* of the blocker 220 may shield a portion of the laser light E3, the portion of the laser light E3 may be prevented from damaging the circuit substrate 110 below.

Please refer to FIG. 2B and FIG. 2F at the same time. Since the light-emitting element 150*h* is shifted upward by the distance D4, a portion of a laser light E4 is not overlapped with the light-emitting element 150*h*. In the present embodiment, since the first portion 220*a* of the blocker 220 may shield a portion of the laser light E4, the portion of the laser light E4 may be prevented from damaging the circuit substrate 110 below.

Based on the above, in the display device of the invention, via the arrangement of the blocker, damage to the circuit substrate may be avoided in the process of removing the light-emitting element, and the production yield or reliability of the display device may be improved.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A display device, comprising:
   a circuit substrate;
   a blocker located on the circuit substrate and having a first side, a second side opposite to the first side, a third side, and a fourth side opposite to the third side;

a first pad located on the circuit substrate and in direct contact with the first side of the blocker;

a second pad located on the circuit substrate and in direct contact with the second side of the blocker;

a light-emitting element located on the blocker, the first pad, and the second pad, and comprising a first electrode and a second electrode;

a first connecting portion connected to the first electrode and the first pad and in direct contact with the first side of the blocker; and a second connecting portion connected to the second electrode and the second pad and in direct contact with the second side of the blocker, an insulating layer between the first pad and the circuit substrate and between the second pad and the circuit substrate;

wherein the blocker protrudes from the insulating layer towards the light-emitting element;

wherein, as seen in plan view, the third side and the fourth side of the blocker are aligned with a side of the first connecting portion and a side of the second connecting portion.

2. The display device of claim 1, wherein lateral side surfaces of the first pad and the second pad not in direct contact with the blocker are exposed.

3. The display device of claim 1, wherein a top surface of the blocker is not higher than a top surface of the first connecting portion, and the top surface of the blocker is not higher than a top surface of the second connecting portion.

4. The display device of claim 1, wherein the blocker has a top surface extending from the first connecting portion to the second connecting portion.

5. The display device of claim 1, wherein the blocker is not in physical contact with the light-emitting element.

6. The display device of claim 1, wherein an orthographic projection of the blocker at the circuit substrate is located between an orthographic projection of the first connecting portion at the circuit substrate and an orthographic projection of the second connecting portion at the circuit substrate.

7. The display device of claim 1, wherein the blocker is sandwiched between the first connecting portion and the second connecting portion.

8. The display device of claim 1, wherein the first connecting portion and the second connecting portion comprise a metal or a conductive adhesive.

9. The display device of claim 1, wherein
the blocker and the insulating layer belong to a same film layer.

10. The display device of claim 1, wherein the circuit substrate comprises an active element, and the active element is electrically connected to the first pad or the second pad.

11. The display device of claim 1, wherein the blocker has an opening, and a spacing between the opening and the third side of the blocker and a spacing between the opening and the fourth side of the blocker are each greater than or equal to 3 µm.

12. The display device of claim 11, wherein a diameter of the opening in a direction perpendicular to the third side or the fourth side is between 8 µm and 12 µm.

13. The display device of claim 11, wherein the opening divides the blocker into a first portion and a second portion, and the first portion has the third side, and the second portion has the fourth side.

14. The display device of claim 13, wherein the first portion is separated from the second portion.

15. The display device of claim 13, wherein a width of the first portion and the second portion in a direction perpendicular to the third side or the fourth side is between 3 µm and 5 µm.

16. The display device of claim 1, wherein the circuit substrate comprises an active element, which is electrically connected to the second pad via a through hole in the insulating layer.

17. The display device of claim 1, wherein the blocker has an opening surrounded by both the first pad and the second pad.

18. The display device of claim 1, wherein an orthographic projection of the blocker on the circuit substrate is completely within an orthographic projection of the light-emitting element on the circuit substrate.

* * * * *